(12) United States Patent
Liu

(10) Patent No.: US 12,276,874 B2
(45) Date of Patent: Apr. 15, 2025

(54) DISPLAY PANEL

(71) Applicant: WUHAN CHINA STAR OPTOELECTRONICS TECHNOLOGY CO., LTD., Hubei (CN)

(72) Inventor: Guangkun Liu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 539 days.

(21) Appl. No.: 17/597,017

(22) PCT Filed: Dec. 6, 2021

(86) PCT No.: PCT/CN2021/135606
§ 371 (c)(1),
(2) Date: Dec. 22, 2021

(87) PCT Pub. No.: WO2023/092642
PCT Pub. Date: Jun. 1, 2023

(65) Prior Publication Data
US 2023/0258968 A1  Aug. 17, 2023

(30) Foreign Application Priority Data

Nov. 23, 2021 (CN) .......................... 202111395492.5

(51) Int. Cl.
*G02F 1/133* (2006.01)
*G02F 1/1333* (2006.01)
(Continued)

(52) U.S. Cl.
CPC .... *G02F 1/13318* (2013.01); *G02F 1/133331* (2021.01); *G02F 1/133553* (2013.01);
(Continued)

(58) Field of Classification Search
CPC ........... G02F 1/13318; G02F 1/133331; G02F 1/133553; G02F 1/133528;
(Continued)

(56) References Cited

U.S. PATENT DOCUMENTS

2010/0013850 A1   1/2010  Kwon
2010/0238150 A1*  9/2010  Matsuki ............... G01J 1/02
                                                      345/207
(Continued)

FOREIGN PATENT DOCUMENTS

CN         1735973 A    2/2006
CN       101814276 A    8/2010
(Continued)

*Primary Examiner* — Michael H Caley
*Assistant Examiner* — William D Peterson
(74) *Attorney, Agent, or Firm* — HSML P. C.

(57) ABSTRACT

A display panel is disclosed and comprising a display substrate, a light sensor, and a light absorption layer; the light sensor is formed in the display substrate and configured to sense ambient light; the light absorption layer is disposed on the display substrate and overlapped with the light sensor; and the material of the light absorption layer comprises at least one of an infrared light absorbent and an ultraviolet light absorbent.

16 Claims, 5 Drawing Sheets

(51) Int. Cl.
*G02F 1/1335* (2006.01)
*H10K 59/80* (2023.01)

(52) U.S. Cl.
CPC .. *G02F 1/133528* (2013.01); *G02F 2201/083* (2013.01); *G02F 2201/086* (2013.01); *G02F 2202/28* (2013.01); *H10K 59/80* (2023.02)

(58) Field of Classification Search
CPC ......... G02F 2201/083; G02F 2201/086; G02F 2202/28; H10K 59/80
USPC .......................................................... 359/361
See application file for complete search history.

(56) References Cited

U.S. PATENT DOCUMENTS

| | | | |
|---|---|---|---|
| 2016/0099272 A1* | 4/2016 | Wang | G02B 5/22 |
| | | | 359/359 |
| 2019/0094069 A1 | 3/2019 | Xu et al. | |
| 2020/0162694 A1 | 5/2020 | Choi et al. | |
| 2020/0382739 A1* | 12/2020 | Lu | H04N 5/58 |

FOREIGN PATENT DOCUMENTS

| | | |
|---|---|---|
| CN | 104341104 A | 2/2015 |
| CN | 105405914 A | 3/2016 |
| CN | 107076895 A | 8/2017 |
| CN | 108345059 A | 7/2018 |
| CN | 110071164 A | 7/2019 |
| CN | 110462462 A | 11/2019 |
| CN | 111653606 A | 9/2020 |
| CN | 112782887 A | 5/2021 |
| CN | 113156681 A | 7/2021 |

* cited by examiner

DISPLAY PANEL

FIELD OF INVENTION

The present application relates the field of display technology, and particularly to a display panel.

BACKGROUND OF INVENTION

The current LCD backlight saving technology basically has the following two types: (1) Light Adaptive Brightness Control (LABC): the backlight control technology corresponding to ambient light detection, light sensor is required, and the brightness of the backlight can be controlled by sensing the intensity of ambient light; (2) Content Adaptive Brightness Control (CABC): the backlight control technology corresponding to the content, the brightness of the backlight is controlled according to the content of the image, so as to reduce the power consumption of the backlight. LABC technology requires an additional light sensor to sense the intensity of ambient light, which will not only occupy the space of the device, but also cost a lot. Therefore, integrating the light sensor into the panel is a current approach to save the space of the device.

During the research and practice of the prior art, the inventor of the present application discovered that, regarding the complexity of sunlight which may include ultraviolet light and infrared light, the light wave of 380 nm to 780 nm is the effective light wave to be used for the ambient light sensor. Ultraviolet and infrared light beyond 380 nm to 780 nm will decrease the sensitivity of the light sensor and affect the detection accuracy of the system.

SUMMARY OF INVENTION

Technical Problems

The embodiments of the present application provide a display panel capable of reducing the effect of stray light on the light sensor.

Technical Solutions

The embodiments of the present application provide a display panel, comprising:
a display substrate;
a light sensor, formed in the display substrate and configured to sense ambient light; and
a light absorption layer, disposed on the display substrate, located at an incident light side, and overlapped with the light sensor; wherein the light absorption layer is configured to absorb invisible light; and the material of the light absorption layer comprises at least one of an infrared light absorbent and an ultraviolet light absorbent.

Optionally, in some embodiments of the present application, the transmittance of visible light of the light absorption layer is a first transmittance, and the transmittance of ultraviolet and infrared light of the light absorption layer is a second transmittance, and wherein the first transmittance is greater than 5%, and the second transmittance is less than 2%.

Optionally, in some embodiments of the present application, the half-peak width of the transmittance spectrum curve of the light absorption layer is between 300 nm to 400 nm, and a peak value of the half-peak corresponding to the transmittance greater than 2% ranges from 380 nm to 780 nm.

Optionally, in some embodiments of the present application, the thickness of the light absorption layer is greater than or equal to 10 microns and less than or equal to 30 microns.

Optionally, in some embodiments of the present application, the light absorption layer comprises at least a first light absorption layer and a second light absorption layer arranged in cascade, the material of the first light absorption layer comprises the infrared light absorbent or the ultraviolet light absorbent, and the second light absorption layer comprises the infrared light absorbent and the ultraviolet light absorbent.

Optionally, in some embodiments of the present application, the material of the light absorption layer comprises the infrared light absorbent or the ultraviolet light absorbent.

Optionally, in some embodiments of the present application, the material of the light absorption layer comprises the infrared light absorbent and the ultraviolet light absorbent.

Optionally, in some embodiments of the present application, the material of the light absorption layer further comprises isophorone, polyurethane acrylic resin, methyl methacrylate, and pigments.

Optionally, in some embodiments of the present application, the display panel further comprises a cover, disposed on the display substrate, wherein the light absorption layer is formed on a side of the cover facing the display substrate.

Optionally, in some embodiments of the present application, the display panel further comprises a light transmitting and reflecting structure layer disposed corresponding to the light sensor, wherein the light transmitting and reflecting structure layer comprises a first light transmitting layer and a second light transmitting layer disposed on the first light transmitting layer, the first light transmitting layer and the second light transmitting layer are connected to each other to form a transmitting-reflecting interface, the first light transmitting layer has a first refractive index n1, and the second light transmitting layer has a second refractive index n2; and wherein the first refractive index n1 is greater than the second refractive index n2, and a ratio of the first refractive index n1 to the second refractive index n2, which is n1/n2, is between 1.1 and 1.5.

Optionally, in some embodiments of the present application, the first refractive index is between 1.7 and 1.9, and the second refractive index is between 1.4 and 1.6.

Optionally, in some embodiments of the present application, the first light transmitting layer and the second light transmitting layer are disposed alternatively in the thickness direction of the display panel.

Optionally, in some embodiments of the present application, the light transmitting and reflecting structure layer is disposed on a side of the cover facing the display substrate and overlapped with the light absorption layer.

Optionally, in some embodiments of the present application, the display panel further comprises a polarizer, disposed on the display substrate, and having an opening; wherein the light transmitting and reflecting structure layer is disposed in the opening, and the light transmitting and reflecting structure layer is overlapped with the light absorption layer.

Optionally, in some embodiments of the present application, the display panel further comprises a cover, disposed on the light absorption layer which is a glue layer; wherein at least part of the light absorption layer includes at least one of the infrared light absorbent and the ultraviolet light absorbent and corresponds to the light sensor.

Optionally, in some embodiments of the present application, part of the light absorption layer includes at least one of the infrared light absorbent and the ultraviolet light absorbent and corresponds to the light sensor.

Optionally, in some embodiments of the present application, the entire light absorption layer includes at least one of the infrared light absorbent and the ultraviolet light absorbent and corresponds to the light sensor.

Optionally, in some embodiments of the present application, the thickness of the light absorption layer is greater than or equal to 50 microns and less than or equal to 200 microns.

Optionally, in some embodiments of the present application, the display panel further comprises a cover, wherein the light absorption layer may also comprise a first light absorption layer and a second light absorption layer, the first light absorption layer is formed on a side of the cover facing the display substrate and corresponding to the light sensor; and wherein the second light absorption layer is a glue layer, and the at least part of the second light absorption layer includes at least one of the infrared light absorbent and the ultraviolet light absorbent and corresponds to the light sensor.

Optionally, in some embodiments of the present application, the display panel comprises a non-display area, wherein the light sensor and the light absorption lay are disposed in the non-display area correspondingly.

The present application further relates to a display device comprising a backlight module and a display panel as described in the above embodiments.

Beneficial Effect

The display panel of the embodiments of the present application comprises a display substrate, a light sensor, and a light absorption layer; the light sensor is formed in the display substrate and configured to sense ambient light; the light absorption layer is disposed on the display substrate and overlapped with the light sensor; and the material of the light absorption layer comprises at least one of the infrared light absorbent and the ultraviolet light absorbent. The present application uses the light absorption layer to absorb infrared light and/or ultraviolet light, so as to reduce the influence of infrared light and/or ultraviolet light on the light sensor, and thus improving the sensitivity of the light sensor.

DESCRIPTION OF DRAWINGS

In order to explain more clearly the technical solution in the present embodiment, the following is a brief introduction of the drawings described in the embodiments. Obviously, the drawings described below are only some embodiments of the present application. For the person having ordinary skill in the art, other drawings can be obtained from these drawings without any creative effort.

DETAILED DESCRIPTION OF EMBODIMENTS

Figure 1:
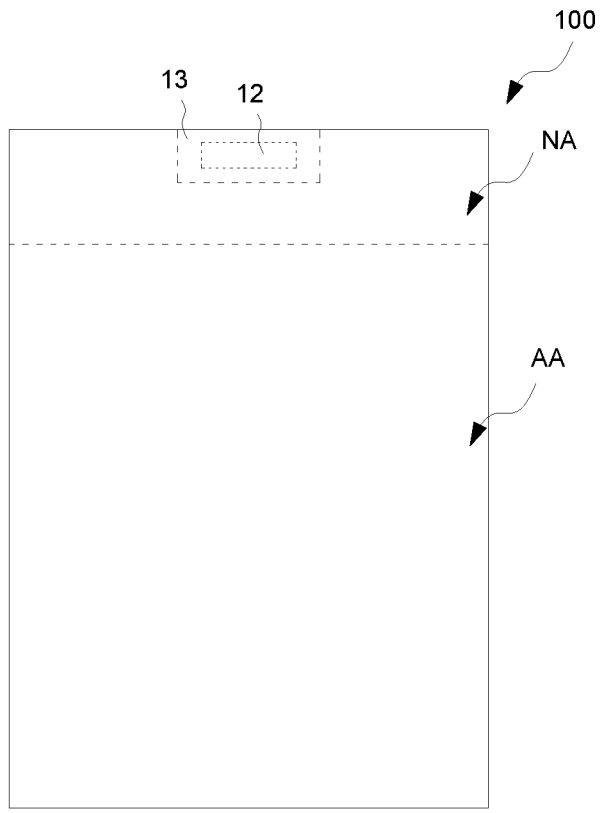
FIG. 1 is a top view of the structural schematic diagram illustrating a display panel according to an embodiment of the present application.

In order to make technical solutions of the present application being clearly and completely described, the present application is further described in detail below with reference to the accompanying drawings and examples. It should be noted that the specific embodiments described herein are only a portion of embodiments, but not all. Other embodiments obtained, without the creative effort, by person having ordinary skill in the art from the embodiments of the present application belong to the claim scope of the present application. In addition, it should be understood that, in the absence of contrary instructions, positional adjectives such as "above/on" and "beneath/under" refer to the actual use or working state of the device, specifically to the direction of the drawing; "inside" and "outside" refer to the contours of the device.

The embodiments of the present application provide a display panel, as detailed below. It should be noted that the order of description of the following embodiments does not limit the priority order of the embodiments.

Figure 2:
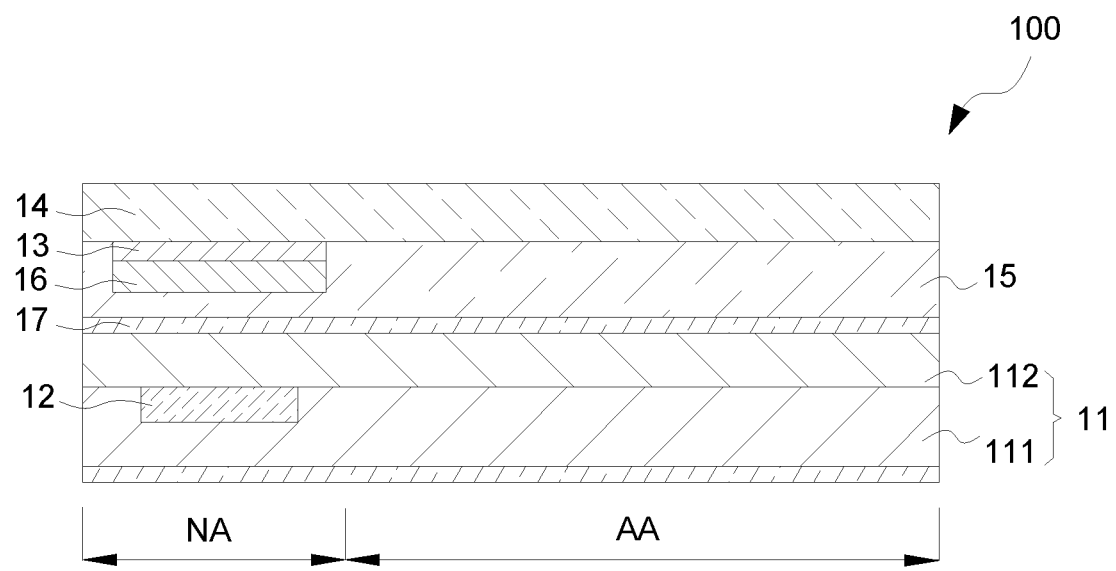
FIG. 2 is a cross-sectional view of the structural schematic diagram illustrating a display panel according to an embodiment of the present application.

Refer to FIG. 1 and FIG. 2, the present embodiment provides a display panel 100 comprising a display substrate 11, a light sensor 12, and a light absorption layer 13.

The light sensor 12 is formed in the display substrate 11 and configured to sense ambient light.

The light absorption layer is disposed on the display substrate 11 and located at an incident light side of the light sensor 12. The light absorption layer 13 is overlapped with the light sensor 12. The light absorption layer 13 is configured to absorb invisible light.

Optionally, the material of the light absorption layer 13 comprises at least one of an infrared light absorbent and an ultraviolet light absorbent.

The present embodiment uses the light absorption layer 13 to absorb infrared light and/or ultraviolet light, so as to reduce the influence of infrared light and/or ultraviolet light on the light sensor 12 and improve the signal-to-noise ratio of the light sensor 12, and thus improving the sensitivity of the light sensor 12.

The light sensor 12 is integrated in the display substrate 11. Optionally, the display substrate 11 of the present embodiment comprises an array substrate 111, a liquid crystal layer (not shown in the figure), and an opposite substrate 112 arranged in sequence. That is, the display substrate 11 is a liquid crystal display substrate. The light sensor 12 is integrated in the array substrate 111.

In some embodiments, display substrate 11 may comprise a substrate as well as a thin film transistor layer, a light-emitting device layer, and a packaging layer arranged in sequence. The light-emitting device layer can be a light-emitting diode layer, such as organic light-emitting diode (OLED), quantum dot light-emitting diode (QLED), sub-millimeter or micro light-emitting diode (Mini-LED or Micro-LED). The light sensor 12 is integrated in the thin film transistor layer.

Optionally, the display panel 100 comprises a non-display area NA. The light sensor 12 and the light absorption layer 13 are disposed in the non-display area NA correspondingly.

The display panel further comprises a display area AA. The non-display area NA is disposed outside the display area AA. The light sensor 12 and the light absorption layer 13 are disposed in the non-display area NA to avoid the influence of the light absorption layer 13 on the display area, and thus improving the display effect.

Of course, in some embodiments, the light sensor 12 and the light absorption layer 13 can be disposed in the display area AA to realize the full screen display and the under-display fingerprint recognition.

Optionally, the material of the light absorption layer 13 further comprises isophorone, polyurethane acrylic resin, methyl methacrylate, and pigments. Of course, the material of the light absorption layer 13 can be other materials of ink.

Optionally, the transmittance of visible light of the light absorption layer 13 is a first transmittance, and the transmittance of ultraviolet and infrared light of the light absorption layer 13 is a second transmittance. The first transmittance is greater than 5%, and the second transmittance is less than 2%.

The first transmittance is greater than 5% to ensure enough light can be detected by the light sensor 12, and the second transmittance is less than 2% to ensure the sensitivity of the light sensor 12.

Optionally, the first transmittance can be less than 10% to reduce ambient light entering the display substrate 11, and thus reducing the emissivity of ambient light and reducing the effect of ambient light on the thin film transistor in the display substrate 11.

Optionally, the first transmittance can be 6%, 7%, 8%, or 9%. The second transmittance can be 0.5%, 1%, or 1.5%.

In some embodiments, the first transmittance can also be 10%, 20%, 30%, 40%, 50%, 60%, 70%. 80%, or 90%.

Figure 3:
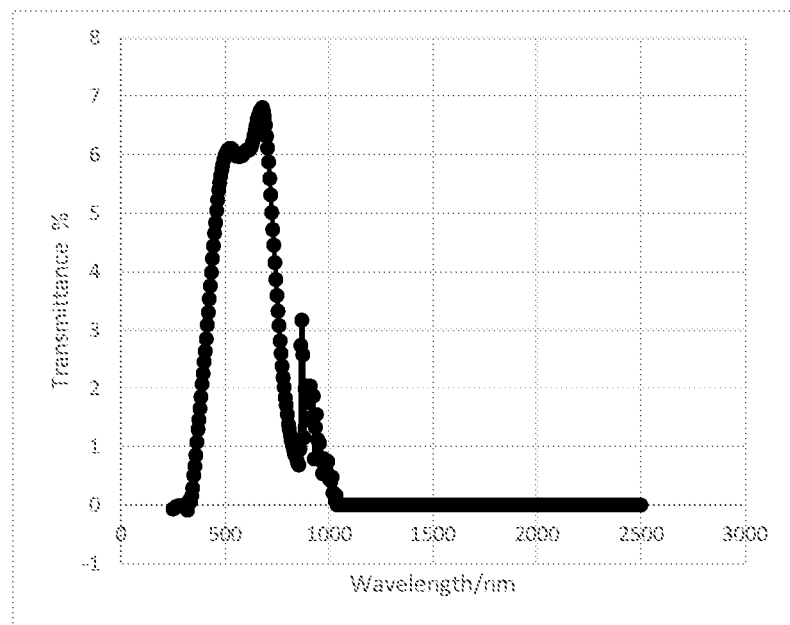
FIG. 3 is a transmittance-wavelength chart of a light absorption layer of a display panel according to an embodiment of the present application.

Refer to FIG. 3, the half-peak width of the transmittance spectrum curve of the light absorption layer 13 is between 300 nm to 400 nm, and a peak value of the half-peak corresponding to the transmittance greater than 2% ranges from 380 nm to 780 nm.

It should be noted that, the half-peak width refers to the peak width at half the height of the peak. The wavelength of visible light is between 380 nm and 780 nm.

The transmittance spectrum curve of the light absorption layer 13 has a first peak value, and the corresponding wavelength of the first peak value is 675±15 nm, that is, the corresponding wavelength of the first peak value is greater than or equal to 650 nm and less than or equal to 690 nm. The transmittance spectrum curve of the light absorption layer 13 has a second peak value, and the corresponding wavelength of the second peak value is 525±15 nm, that is, the corresponding wavelength of the second peak value is greater than or equal to 510 nm and less than or equal to 540 nm.

The transmittance of visible light is significantly improved only when the half-peak width is greater than 300 nm, so that the sensitivity of the light sensor 12 is improved.

In addition, the transmittance of the first peak value is 6.12% at 525 nm. The transmittance of the second peak value is 6.78% at 675 nm. The transmittance of the valley value is 5.96% at 570 nm.

The transmittance of the light absorption layer 13 increases in the wavelength range from 345 nm to 380 nm of the ultraviolet wavelength region.

The transmittance of the ultraviolet light fluctuates around zero from wavelengths below 330 nm.

The transmittance of the light absorption layer 13 decreases in the wavelength range from 800 nm to 855 nm of the infrared wavelength region Optionally, the display panel 100 further comprises a cover 14. The cover 14 is disposed on the display substrate 11. The light absorption layer 13 is formed on a side of the cover 14 facing the display substrate 11.

The display panel 100 further comprises a glue layer 15, which is disposed between the cover 14 and the display substrate 11.

The light absorption layer 13 is disposed on the side close to the glue layer 15. The glue layer 15 is used to compensate the mismatch discrepancy of the light absorption layer 13 to keep the flatness of the cover 14.

Optionally, the material of the light absorption layer 13 comprises the infrared light absorbent and the ultraviolet light absorbent.

Optionally, the thickness of the light absorption layer 13 is greater than or equal to 10 microns and less than or equal to 30 microns. For example, it could be 10 microns, 15 microns, 20 microns, 25 microns, or 30 microns.

Figure 4:
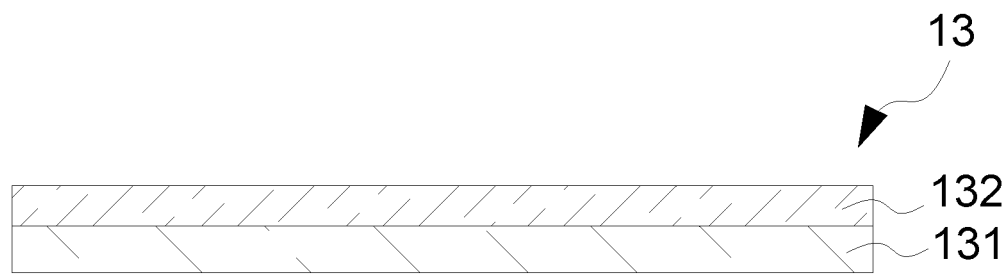
FIG. 4 is a structural schematic diagram illustrating a light absorption layer of a display panel according to an embodiment of the present application.

Optionally, refer to FIG. 4, the light absorption layer 13 comprises at least a first light absorption layer 131 and a second light absorption layer 132 arranged in cascade. The material of the first light absorption layer 131 comprises the infrared light absorbent or the ultraviolet light absorbent. The second light absorption layer 132 comprises the infrared light absorbent and the ultraviolet light absorbent.

When the thickness of the light absorption layer 13 is between 10 microns and 30 microns, the cascade structure of the first absorption layer 131 and the second absorption layer 132 set in the light absorption layer 13 can improve the sensitivity of the light sensor 12.

Optionally, the light absorption layer 13 may be a double layer structure, such as the light absorption layer 13 merely including the first light absorption layer 131 and the second light absorption layer 132 arranged in cascade.

Optionally, in some embodiments, the light absorption layer 13 may comprise a multi-layer structure, such as the light absorption layer 13 including the first light absorption layer 131 and the second light absorption layer 132, in which the first light absorption layer 131 and the second light absorption layer 132 are arranged in cascade alternatively.

Either of the first light absorption layer 131 and the second light absorption layer 132 can be used as the substrate film layer. For example, the light absorption layer 13 can successively comprise a first light absorption layer 131, a second light absorption layer 132, and a first light absorption layer; or successively comprises a second light absorption layer 132, a first light absorption layer 131, and a second light absorption layer 132.

In some embodiments, the light absorption layer 13 may be a single layer structure.

In some embodiments, the material of the light absorption layer may comprise the infrared light absorbent or the ultraviolet light absorbent.

Optionally, the light absorption layer 13 can be formed on the cover 14 by silk screening. In order to avoid the alignment offset between the light absorption layer 13 and the light sensor 12, the area of the light absorption layer 13 should be larger than that of the light sensor 12.

Specifically, since the tolerance relationship meets the formula $Z=(x^2+y^2)^{1/2}$ in the silk screening process, where Z is the cumulative tolerance, x is the silk screen tolerance, and y is the cover fitting tolerance, the distance between the edge of the light absorption layer 13 and the edge of the light sensor 12 needs to be the cumulative tolerance to ensure the light absorption layer 13 can completely block the light sensor 12.

Figure 5:
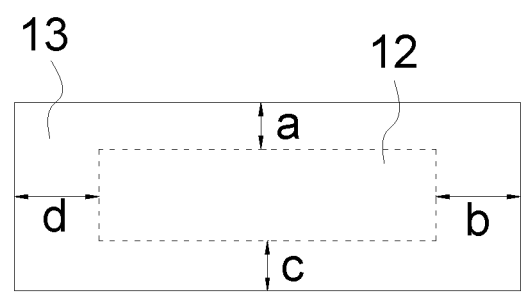
FIG. 5 is a structural schematic diagram illustrating a display panel silk screening a light absorption layer according to an embodiment of the present application.

For example, if the silk screen tolerance x is equal to ±0.1 mm and the cover fitting tolerance y is equal to ±0.18 mm, the cumulative tolerance is equal to ±0.21 mm, and the silk screen principle of ink is: printing the light absorption layer 13 directly above the light sensor 12, in which the distances, including the first distance a, the second distance b, the third distance c, and the fourth distance d, between the four edges of the light absorption layer 13 and the four edges of the light sensor 12 are larger than 0.21 mm, as shown in FIG. 5.

Figure 6:
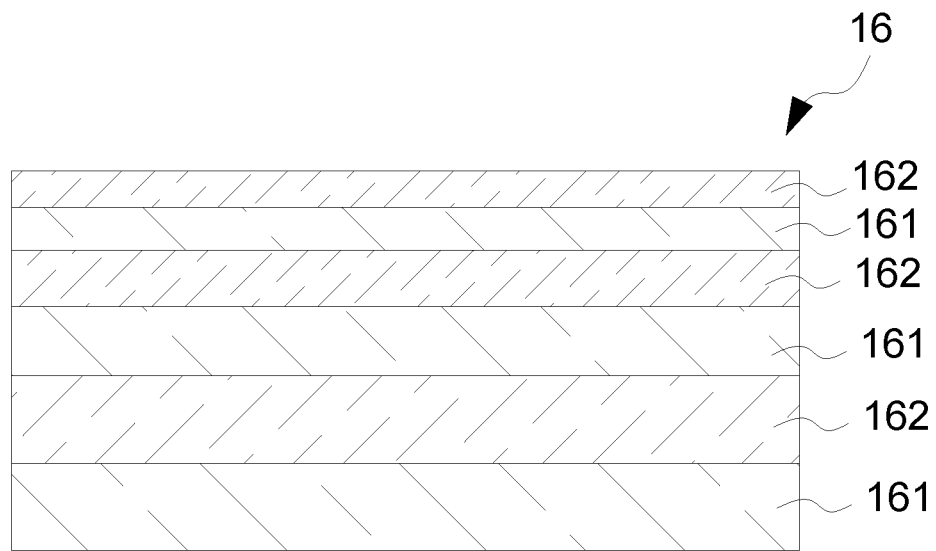
FIG. 6 is a structural schematic diagram illustrating a light transmitting and reflecting structure layer embodiment of the present application.

Optionally, refer to FIG. 6, the display panel 100 further comprises a light transmitting and reflecting structure layer 16 disposed corresponding to the light sensor 12. The light transmitting and reflecting structure layer 16 comprises a first light transmitting layer 161 and a second light transmitting layer 162 disposed on the first light transmitting layer 161, the first light transmitting layer 161 and the second light transmitting layer 162 are connected to each other to form a transmitting-reflecting interface. The first light transmitting layer 161 has a first refractive index n1, and the second light transmitting layer 162 has a second refractive index n2.

The light transmitting and reflecting structure layer 16 is configured to reflect ultraviolet and/or infrared light.

The first refractive index n1 is greater than the second refractive index n2. The ratio n1/n2 of the first refractive index n1 to the second refractive index n2 is between 1.1 and 1.5.

Optionally, the ratio n1/n2 can be 1.1, 1.14, 1.17, 1.2, 1.24, 1.27, 1.3, 1.35, 1.4, 1.45, or 1.5.

The ratio n1/n2 is between 1.1 and 1.5, which is beneficial to improve the transmittance of visible light and reduce the transmittance of infrared light and ultraviolet light.

Optionally, the first refractive index is between 1.7 and 1.9; such as 1.7, 1.75, 1.8, 1.84, or 1.9. The second refractive index is between 1.4 and 1.6; such as 1.4, 1.49, 1.57, or 1.6.

Optionally, the material of the first light transmitting layer 161 can be zirconia or titanium oxide, etc. The material of the second light transmitting layer 162 can be silicon oxide or polyester resin, etc.

It should be noted that, the ultraviolet band is between 250 nm and 380 nm, the infrared band is between 800 nm and 2500 nm. The reflection formula of light wavelength: $\lambda=2*(n1*d1+n2*d2)$, where $\lambda$ is the wavelength, n1 is the first refractive index, n2 is the second refractive index, d1 is the first thickness, and d2 is the second thickness.

The light transmitting and reflecting structure layer 16 is configured to reflect ultraviolet and/or infrared light. For example, if wave with light wavelength 350 nm is reflected, the light wavelength 350 nm is equal to the formula $2*(n1*d1+n2*d2)$.

Optionally, the first light transmitting layer 161 and the second light transmitting layer 162 are disposed alternatively in the thickness direction of the display panel 100. By alternatively disposing the multi-layered first light transmitting layer 161 and the second light transmitting layer 162, more wavelengths of ultraviolet and/or infrared light can be reflected.

Optionally, Optionally, in the thickness direction of the display panel 100, the thickness of the adjacent first light transmitting layer 161 decreases, and the thickness of the adjacent second light transmitting layer 162 decreases, so that the different wavelengths of light can be reflected.

Optionally, the light transmitting and reflecting structure layer 16 is disposed on a side of the cover 14 facing the display substrate 11. The light transmitting and reflecting structure layer 16 is overlapped with the light absorption layer 13. By such structure, the ambient light can be filtered twice via the light transmitting and reflecting structure layer 16.

Specifically, since the tolerance relationship meets the formula $Z=(x^2+y^2)^{1/2}$ in the coating process of the light transmitting and reflecting structure layer 16, where Z is the cumulative tolerance, x is the coating tolerance, and y is the cover fitting tolerance, the distance between the edge of the light transmitting and reflecting structure layer 16 and the edge of the light sensor 12 needs to be the cumulative tolerance to ensure the light transmitting and reflecting structure layer 16 can completely block the light sensor 12.

For example, if the coating tolerance x is equal to ±0.05 mm and the cover fitting tolerance y is equal to ±0.18 mm, the cumulative tolerance is equal to ±0.19 mm, and the coating principle is: coating the light transmitting and reflecting layer 16 directly above the light sensor 12, in which the distances, including the first distance, the second distance, the third distance, and the fourth distance, between the four edges of the light transmitting and reflecting layer 16 and the four edges of the light sensor 12 are larger than 0.19 mm.

Figure 7:
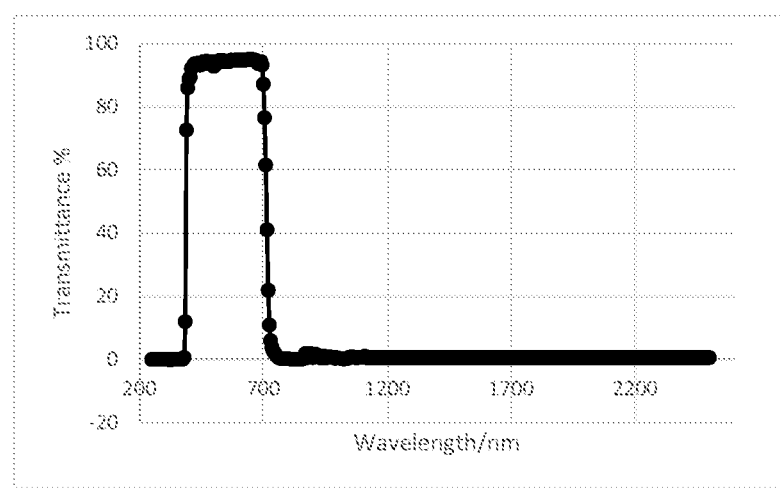
FIG. 7 is a transmittance-wavelength chart of a light transmitting and reflecting structure layer of a display panel according to an embodiment of the present application.

Optionally, the transmittance of visible light is greater than 90%, and that of infrared and ultraviolet light is less than 2%, as shown in FIG. 7.

Optionally, the display panel 100 further comprises a polarizer 17, which is disposed on the display substrate 11.

Figure 8:
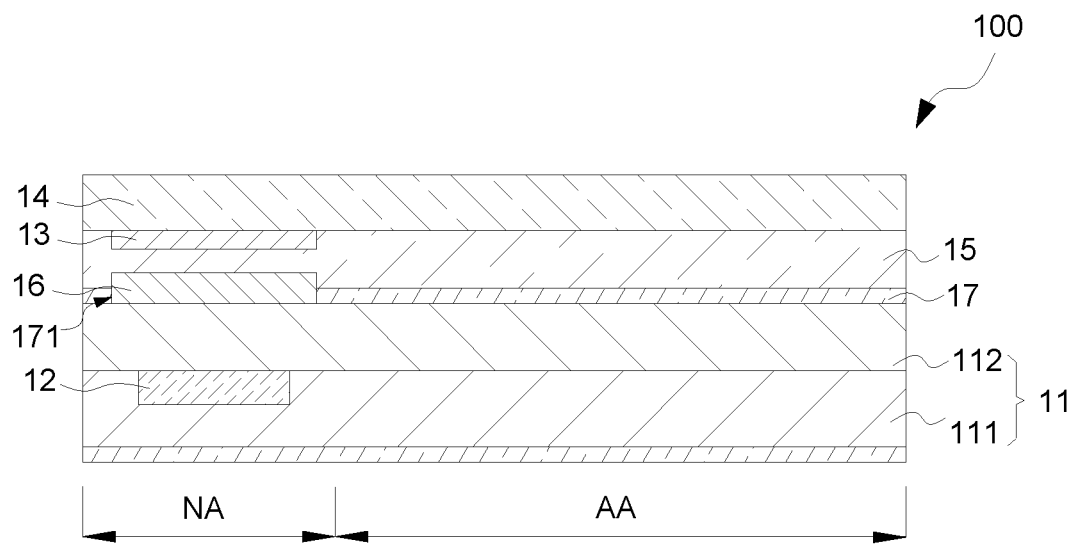
FIG. 8 is a structural schematic diagram illustrating a display panel according to another embodiment of the present application.

Optionally, refer to FIG. 8, in some embodiments of the present application, the display panel 100 further comprises the polarizer 17 disposed on the display substrate 11. The polarizer 17 has an opening 171. The light transmitting and reflecting structure layer 16 is disposed in the opening 171. The light transmitting and reflecting structure layer is overlapped with the light absorption layer. In the present embodiment, the light transmitting and reflecting structure layer 16 is disposed in the opening 171, which avoids ambient light filtered by the polarizer 17 and improve the transmittance of visible light; and thus reducing the thickness of the display panel 100.

Compared to the previous embodiment, the light transmitting and reflecting structure layer 16 is disposed in the opening instead of on the cover 14 in the present embodiment.

The principle of digging opening is that: the four edges of the opening 171 should be greater than the cumulative tolerance Z, which meets the formula $Z=(x^2+y^2)^{1/2}$, where Z is the cumulative tolerance, x is the cutting tolerance, y is the polarizer fitting tolerance.

Figure 9:
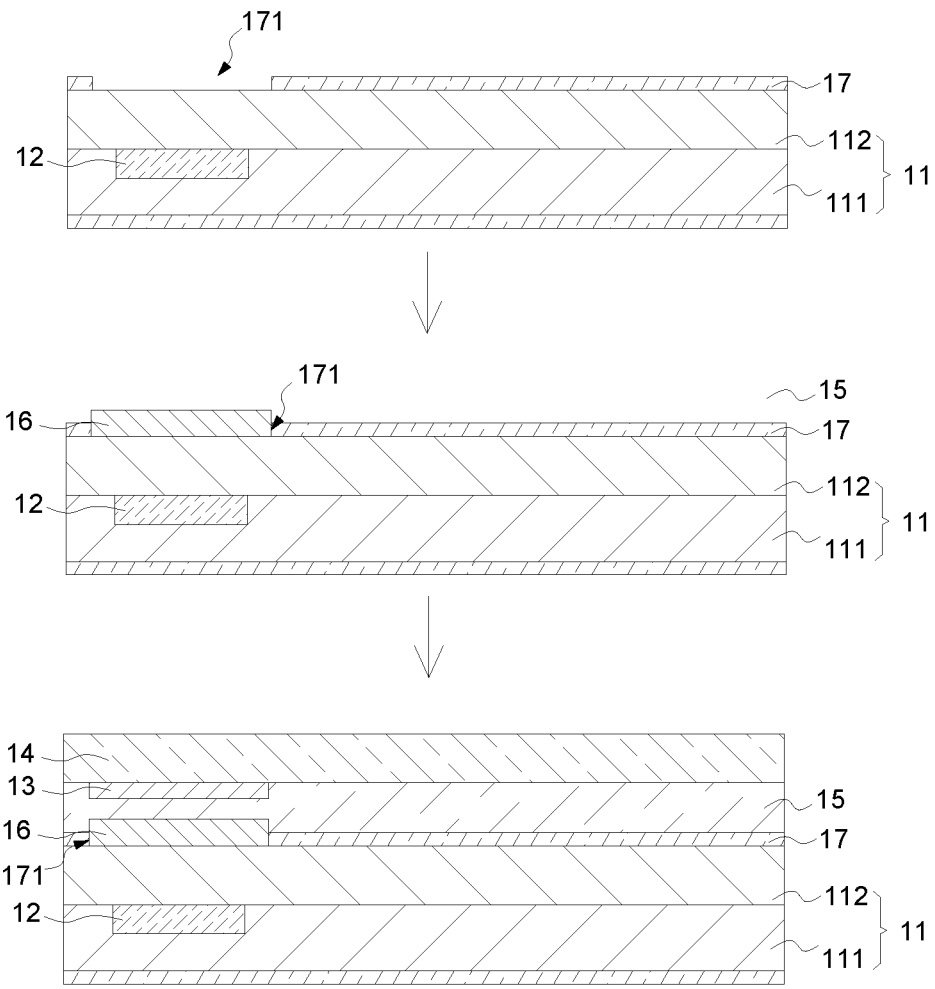
FIG. 9 is a flowchart illustrating a fabricating process of a display panel according to another embodiment of the present application.

Refer to FIG. 9, the fabricating process of the display panel 100 of the present embodiment comprises: attaching two layers of the polarizer 17 onto both sides of the display substrate 11; then, digging the non-display area NA to form the opening 171; disposing the light transmitting and reflecting structure layer 16 in the opening 171; covering the display substrate 11 with the cover 14 having the glue layer 15, in which the glue layer 15 is configured to flat the mismatch discrepancy, so as to ensure the flatness of the cover 14. Thus, the fabricating process of the present embodiment is completed.

In the present application, optionally, the ultraviolet and infrared light entering the light sensor 12 is less than 1% of the ambient light, such as 1%, 0.8%, 0.5%, 0.3%, and so on; the visible light entering the light sensor 12 is greater than 2% of the ambient light, such as 2%, 2.5%, 3%, 5%, 10%, 20%, and so on.

Figure 10:
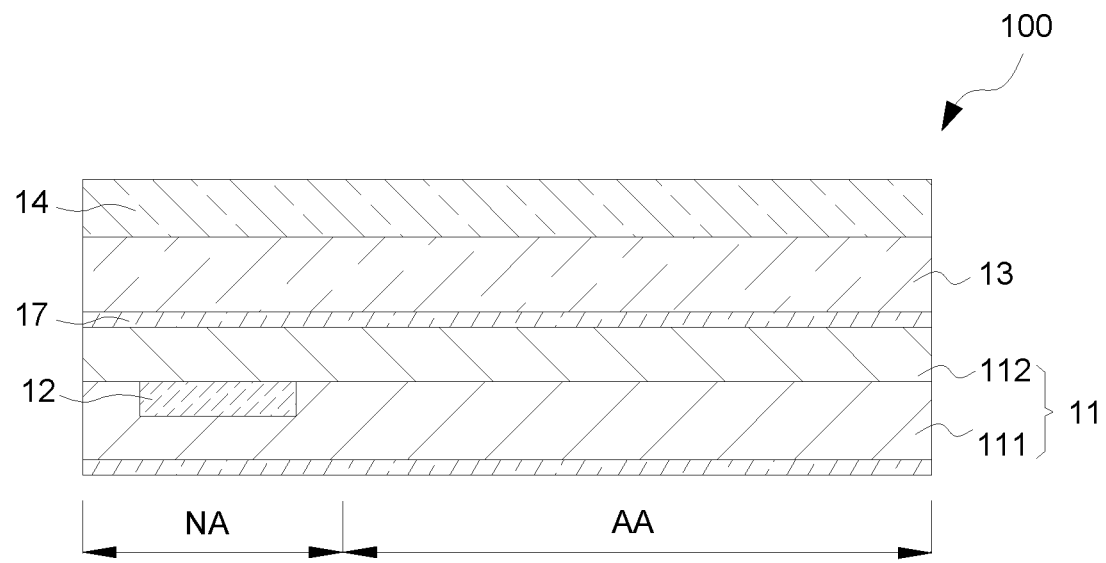
FIG. 10 is a structural schematic diagram illustrating a display panel according to still another embodiment of the present application.

Refer to FIG. 10, compared to the above embodiments, the difference between the present embodiment and the above embodiments is that: the display panel 100 further comprises the cover 14, which is disposed on the light absorption layer 13. The light absorption layer 13 is a glue layer. At least part of the light absorption layer 13 comprises at least one of the infrared light absorbent and the ultraviolet light absorbent and corresponds to the light sensor 12.

The display panel 100 of the present embodiment has at least one of the partially doped infrared and ultraviolet absorbent corresponding to the light sensor 12, so as to achieve the effect of absorbing infrared and/or ultraviolet light.

That is, the light absorption layer 13 can be partially doped with the infrared absorbent and/or the ultraviolet absorbent, or it can be fully doped with the infrared absorbent and/or the ultraviolet absorbent.

Optionally, the thickness of the light absorption layer 13 is greater than or equal to 50 microns and less than or equal to 200 microns, for example, the thickness of the light absorption layer 13 can be 50 microns, 100 microns, 150 microns, or 200 microns.

Figure 11:
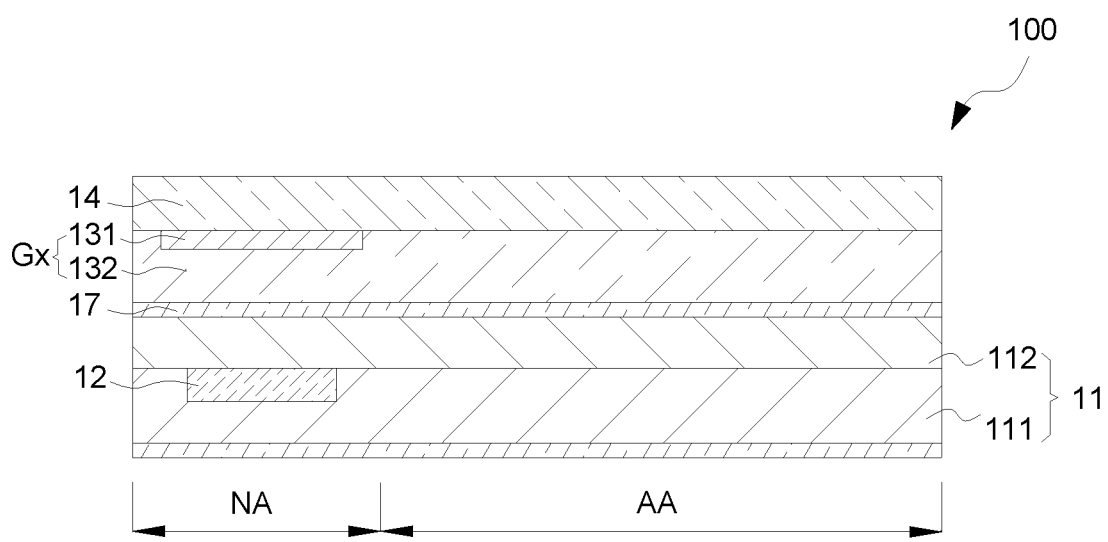
FIG. 11 is a structural schematic diagram illustrating a display panel according to yet another embodiment of the present application.

In addition, in some embodiments, as shown in FIG. 11, the light absorption layer Gx may comprise a first light absorption layer 131 and a second light absorption layer 132. The first light absorption layer 131 is formed on a side of the cover 14 facing the display substrate 11 and corresponds to the light sensor 12. The second light absorption layer 132 is a glue layer, and at least part of the second light absorption layer 132 comprises at least one of the infrared absorbent and the ultraviolet absorbent and corresponds to the light sensor 12. The dual light absorption layer is used to further absorb infrared and/or ultraviolet light.

That is, the first light absorption layer 131 is corresponding to the light absorption layer of the display panel 100 in FIG. 2; and the second light absorption layer 132 is corresponding to the light absorption layer of the display panel 100 in FIG. 10.

Specific exemplary embodiments are used to explain the principle and implementation of the present application in the disclosure. However, the above embodiments are intended merely to assist in understanding the present application. It can be understood that those having ordinary skills of the art may easily contemplate various changes and modifications of the technical solution and technical ideas of the present application. In summary, the contents in the specification should not be considered as a limitation of the present application.

What is claimed is:
1. A display panel, comprising:
a display substrate
a light sensor, formed in the display substrate and configured to sense ambient light; and
a light absorption layer, disposed on the display substrate, located at an incident light side, and overlapped with the light sensor; wherein a material of the light absorption layer comprises an infrared light absorbent and an ultraviolet light absorbent;
wherein a transmittance of visible light of the light absorption layer is a first transmittance, and a transmittance of ultraviolet and infrared light of the light absorption layer is a second transmittance, and wherein the first transmittance is greater than 5%, and the second transmittance is less than 2%;
wherein the transmittance of the light absorption layer decreases in a wavelength range from 800 nm to 855 nm of the infrared wavelength region;
wherein a half-peak width of the transmittance spectrum curve of the light absorption layer, referring to a peak width at half a height of the peak, ranges from 300 nm to 400 nm, and a peak value of the half-peak corresponding to the transmittance greater than 2% ranges from 380 nm to 780 nm.

2. The display panel as claimed in claim 1, wherein a thickness of the light absorption layer is greater than or equal to 10 microns and less than or equal to 30 microns.

3. The display panel as claimed in claim 2, wherein the light absorption layer comprises at least a first light absorption layer and a second light absorption layer arranged in cascade, a material of the first light absorption layer comprises the infrared light absorbent or the ultraviolet light absorbent, and the second light absorption layer comprises the infrared light absorbent and the ultraviolet light absorbent.

4. The display panel as claimed in claim 1, wherein the material of the light absorption layer further comprises isophorone, polyurethane acrylic resin, methyl methacrylate, and pigments.

5. The display panel as claimed in claim 1, further comprising a cover, disposed on the display substrate, wherein the light absorption layer is formed on a side of the cover facing the display substrate.

6. The display panel as claimed in claim 5, further comprising a light transmitting and reflecting structure layer disposed corresponding to the light sensor, wherein the light transmitting and reflecting structure layer comprises a first light transmitting layer and a second light transmitting layer disposed on the first light transmitting layer, the first light transmitting layer and the second light transmitting layer are connected to each other to form a transmitting-reflecting interface, the first light transmitting layer has a first refractive index n1, and the second light transmitting layer has a second refractive index n2; and
wherein the first refractive index n1 is greater than the second refractive index n2, and a ratio of the first refractive index n1 to the second refractive index n2, which is n1/n2, is between 1.1 and 1.5.

7. The display panel as claimed in claim 6, wherein the first refractive index is between 1.7 and 1.9, and the second refractive index is between 1.4 and 1.6.

8. The display panel as claimed in claim 6, wherein the first light transmitting layer and the second light transmitting layer are disposed alternatively in a thickness direction of the display panel.

9. The display panel as claimed in claim 6, wherein the light transmitting and reflecting structure layer is disposed on a side of the cover facing the display substrate and overlapped with the light absorption layer.

10. The display panel as claimed in claim 6, further comprising a polarizer, disposed on the display substrate, and having an opening; wherein the light transmitting and reflecting structure layer is disposed in the opening, and the light transmitting and reflecting structure layer is overlapped with the light absorption layer.

11. The display panel as claimed in claim 1, further comprising a cover, disposed on the light absorption layer which is a glue layer; wherein at least part of the light absorption layer includes at least one of the infrared light absorbent and the ultraviolet light absorbent and corresponds to the light sensor.

12. The display panel as claimed in claim 11, wherein part of the light absorption layer includes at least one of the infrared light absorbent and the ultraviolet light absorbent and corresponds to the light sensor.

13. The display panel as claimed in claim 11, wherein the entire light absorption layer includes at least one of the infrared light absorbent and the ultraviolet light absorbent and corresponds to the light sensor.

14. The display panel as claimed in claim 11, wherein a thickness of the light absorption layer is greater than or equal to 50 microns and less than or equal to 200 microns.

15. The display panel as claimed in claim 1, further comprising a cover, wherein the light absorption layer comprises a first light absorption layer and a second light absorption layer, the first light absorption layer is formed on a side of the cover facing the display substrate and corresponding to the light sensor; and wherein the second light absorption layer is a glue layer, and the at least part of the second light absorption layer includes at least one of the infrared light absorbent and the ultraviolet light absorbent and corresponds to the light sensor.

16. The display panel as claimed in claim 1, further comprising a non-display area, wherein the light sensor and the light absorption lay are disposed in the non-display area correspondingly.

* * * * *